United States Patent
Badaroglu et al.

(10) Patent No.: US 10,411,091 B1
(45) Date of Patent: Sep. 10, 2019

(54) INTEGRATED CIRCUITS EMPLOYING A FIELD GATE(S) WITHOUT DIELECTRIC LAYERS AND/OR WORK FUNCTION METAL LAYERS FOR REDUCED GATE LAYOUT PARASITIC RESISTANCE, AND RELATED METHODS

(71) Applicant: QUALCOMM Incorporated, San Diego, CA (US)

(72) Inventors: Mustafa Badaroglu, Kessel-Lo (BE); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/034,746

(22) Filed: Jul. 13, 2018

(51) Int. Cl.
*H01L 29/06* (2006.01)
*H01L 29/66* (2006.01)
*H01L 27/092* (2006.01)
*H01L 29/417* (2006.01)
*H01L 29/40* (2006.01)
*H01L 29/78* (2006.01)

(52) U.S. Cl.
CPC ...... *H01L 29/0684* (2013.01); *H01L 27/0924* (2013.01); *H01L 29/405* (2013.01); *H01L 29/41791* (2013.01); *H01L 29/66795* (2013.01); *H01L 29/785* (2013.01); *H01L 2029/7858* (2013.01)

(58) Field of Classification Search
CPC ............. H01L 29/0684; H01L 27/0924; H01L 29/66795
USPC ....................................................... 257/365
See application file for complete search history.

(56) References Cited

U.S. PATENT DOCUMENTS

| | | | |
|---|---|---|---|
| 8,227,870 B2 | 7/2012 | Chudzik et al. | |
| 8,652,956 B2 | 2/2014 | Beyer et al. | |
| 8,735,236 B2 | 5/2014 | Hempel et al. | |
| 9,391,075 B2 | 7/2016 | Xie et al. | |
| 9,455,201 B2 | 9/2016 | Joshi et al. | |
| 9,576,952 B2 | 2/2017 | Joshi et al. | |
| 9,685,371 B2 | 6/2017 | Zope et al. | |
| 2012/0211812 A1* | 8/2012 | Du ..................... H01L 29/0653 | |
| | | | 257/296 |
| 2013/0032893 A1 | 2/2013 | Pal et al. | |
| 2016/0104704 A1 | 4/2016 | Fang et al. | |
| 2016/0111514 A1 | 4/2016 | Zang | |
| 2017/0186848 A1* | 6/2017 | Yang ................. H01L 21/28088 | |

* cited by examiner

*Primary Examiner* — Igwe U Anya
(74) *Attorney, Agent, or Firm* — Withrow & Terranova, PLLC

(57) ABSTRACT

Integrated circuits employing a field gate(s) without dielectric layers and/or work function metal layers for reduced gate layout parasitic resistance, and related methods are disclosed. At least a portion of the dielectric layers and/or work function metal layers present in active gate(s) is not present in a field gate(s) of a gate in a circuit cell. The field gate(s) have more conductive gate material than the active gate(s). In this manner, the increased volume of gate material in the field gate(s) reduces gate layout parasitic resistance. The active gate(s) retains the dielectric layers and/or work function metal layers to effectively isolate the gate material from a channel of a FET formed from the circuit cell to provide effective channel control. Reducing gate layout parasitic resistance can reduce current (I) resistance (R) (IR) drop to achieve the desired drive strength in the integrated circuit.

21 Claims, 14 Drawing Sheets

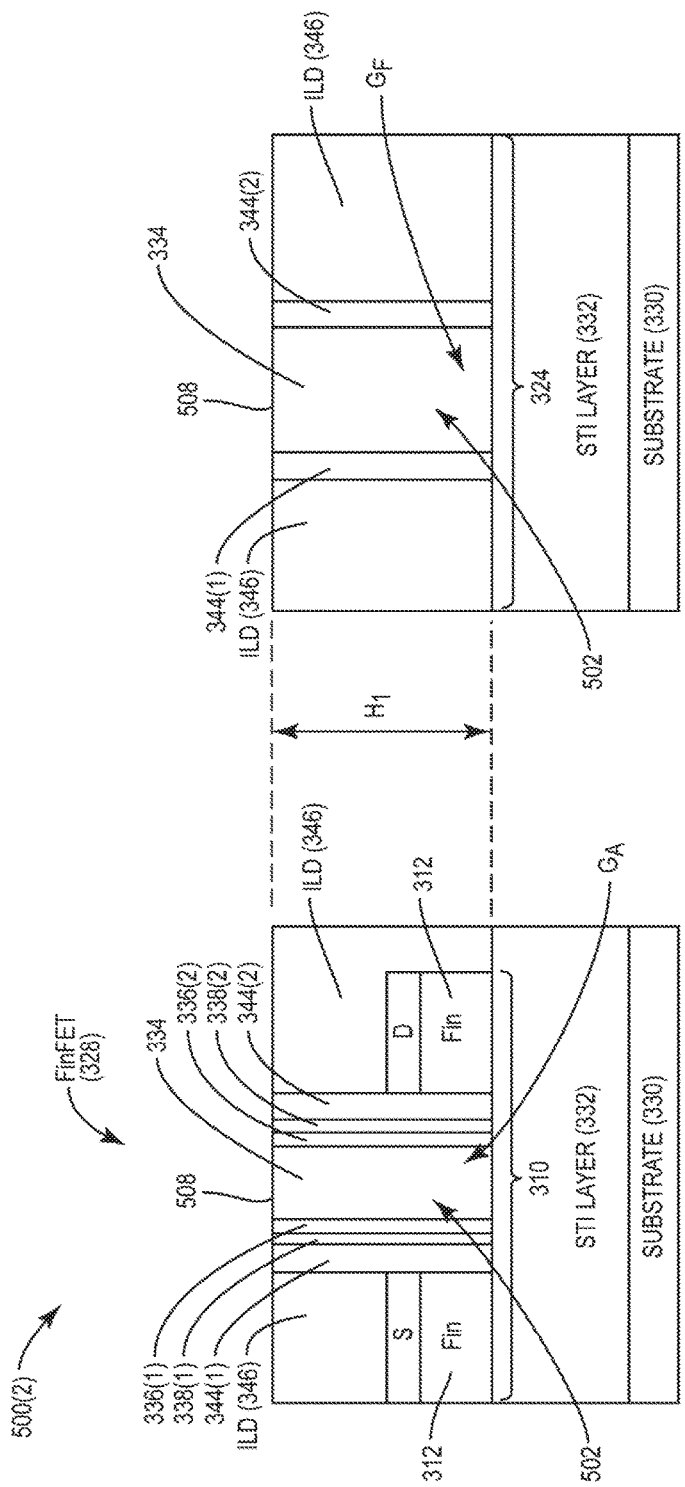

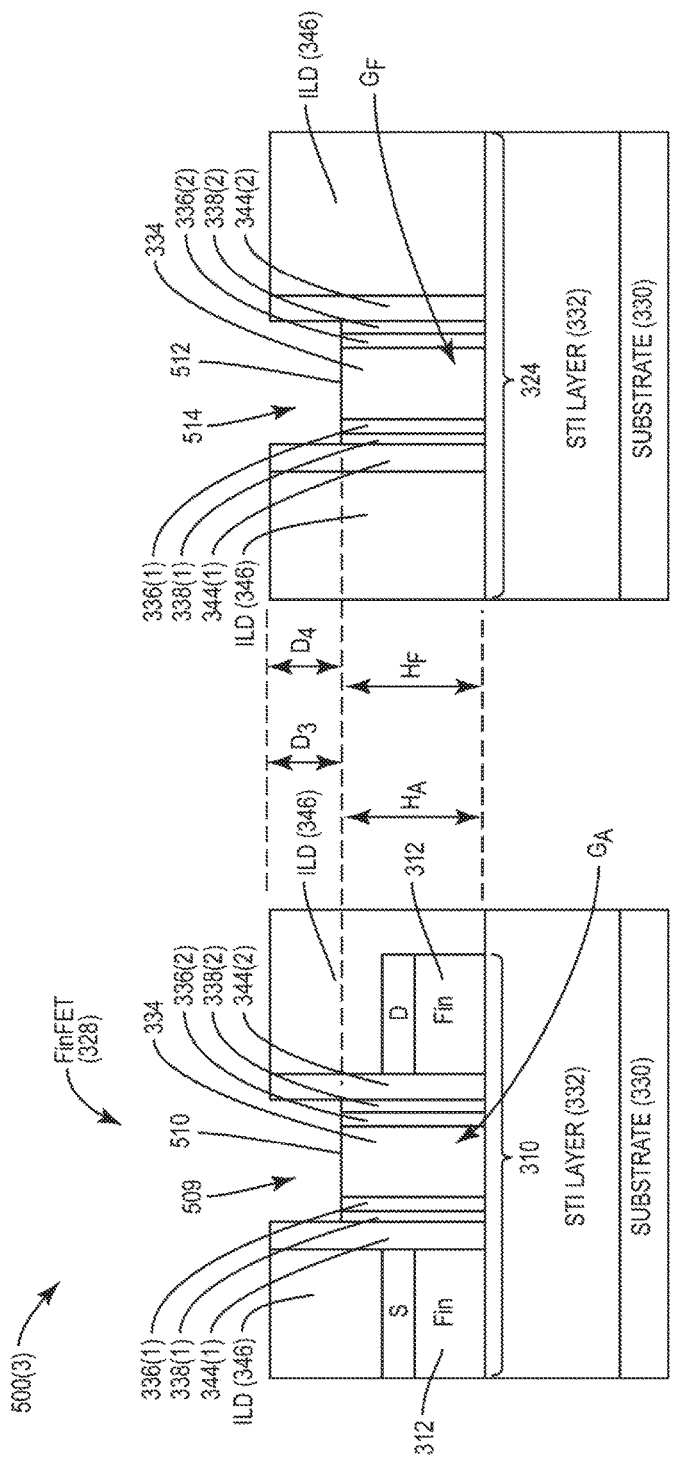

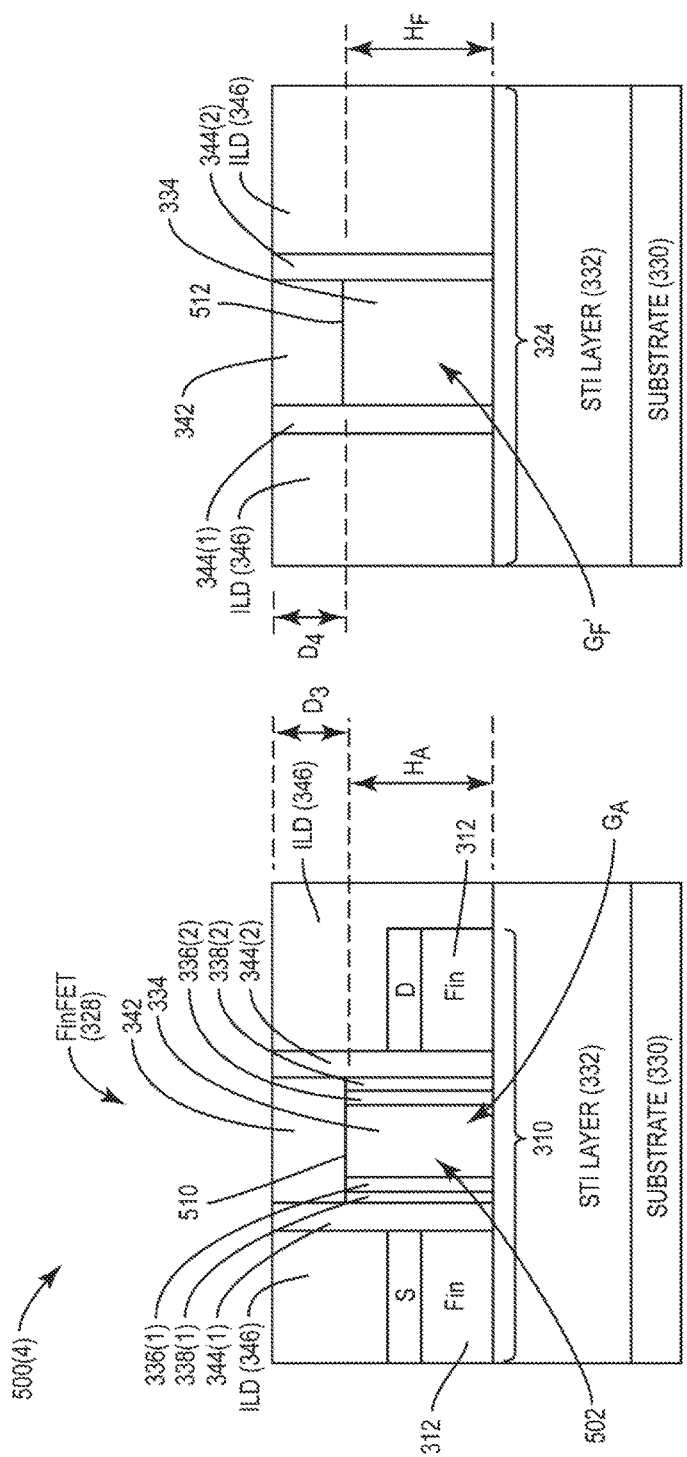

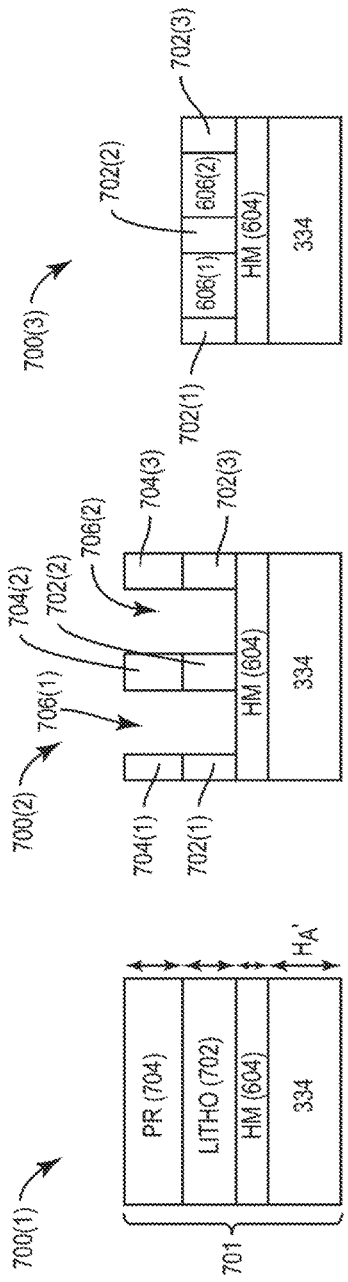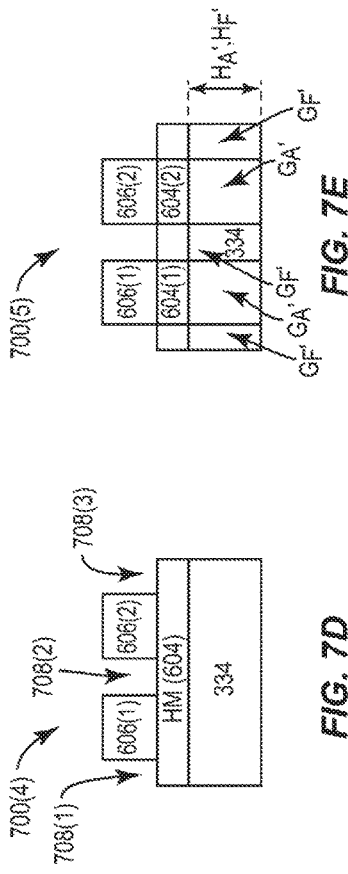

INTEGRATED CIRCUITS EMPLOYING A FIELD GATE(S) WITHOUT DIELECTRIC LAYERS AND/OR WORK FUNCTION METAL LAYERS FOR REDUCED GATE LAYOUT PARASITIC RESISTANCE, AND RELATED METHODS

BACKGROUND

I. Field of the Disclosure

The technology of the disclosure relates generally to integrated circuits, such as planar transistors, Fin Field-Effect Transistors (FETs) (FinFETs), and gate-all-around (GAA) transistors, formed from a circuit cell, such as a complementary metal-oxide semiconductor (CMOS) standard cell, in integrated circuits (ICs).

II. Background

Transistors are essential components in modern electronic devices, and large numbers of transistors are employed in integrated circuits (ICs) therein. For example, components such as central processing units (CPUs) and memory systems each employ a large quantity of transistors for logic circuits and memory devices. For example, FIG. 1 illustrates a conventional complementary metal-oxide semiconductor (CMOS) Fin Field-Effect Transistor (FET) 100 ("FinFET 100") as an example of a transistor. A FinFET includes a gate material wrapped around at least a portion of a channel structure to provide better gate control over an active channel therein. Better gate control provides reduced current leakage and increased threshold voltage as compared to a planar transistor of a similar footprint.

In this regard, FIG. 1 illustrates the FinFET 100 as including a substrate 102 and Fins 104A, 104B made of a semiconductor material and disposed above the substrate 102 to form a semiconductor material structure 106 across the FinFET 100. The FinFET 100 further includes source/drain elements 108A, 108B disposed above the Fins 104A, 104B, respectively, to provide a source and drain for the FinFET 100. The FinFET 100 further includes a source/drain contact 112A disposed on the substrate 102 to provide a contact to the source/drain elements 108A, 108B. The FinFET 100 further includes a source/drain contact 112B on a side 110 of the FinFET 100 to provide a contact to drain/source regions (not shown). The FinFET 100 further includes spacer layers 114A and 114B (e.g., a Nitride-based low-k material or air) disposed on the substrate 102 to isolate the source/drain contacts 112A, 112B, respectively, from a "wrap-around" gate 116 disposed on the substrate 102 and over the Fins 104A, 104B between the spacer layers 114A, 114B. The FinFET 100 further includes a gate contact 118 disposed on the gate 116 to provide a contact to the gate 116. The FinFET 100 further includes an interlayer dielectric (ILD) 120 to isolate active components of the FinFET 100 from other devices disposed near the FinFET 100. Thus, FinFETs such as the FinFET 100 in FIG. 1 are capable of delivering high current through a small silicon footprint. Improved electrostatic control and a taller Fin height enable high "ON" current for FinFETs.

For example, FIG. 2A illustrates a top view of a layout 200 of a conventional standard cell 202 that can be used to form FinFETs, such as the FinFET 100 in FIG. 1, to illustrate the parasitic capacitances between the gate and source/drain of the FinFETs. The standard cell 202 includes gates 204(1)-204(4) disposed in a first direction 206 on a Y-axis with a defined gate pitch $G_P$. The standard cell 202 includes a first voltage rail 208 configured to be coupled to a supply voltage. The first voltage rail 208 is disposed in a second direction 210 on an X-axis substantially orthogonal to the first direction 206 in a first metal layer 212 (e.g., a metal zero (M0) metal layer). Additionally, the standard cell 202 includes a second voltage rail 214 disposed in the second direction 210 in the first metal layer 212. The standard cell 202 also includes diffusion regions 216P, 216N of P-type doped and N-type doped semiconductor materials, respectively, for forming active devices that include semiconducting materials, such as transistors. The standard cell 202 also includes Fins 218(1)-218(4) for forming semiconductor channels of FinFETs disposed in the second direction 210 between the first and second voltage rails 208, 214. In this example, a FinFET formed in the diffusion region 216P will include two Fins 218(1)-218(2) to form its semiconductor channel, and a FinFET formed in the diffusion region 216N will include two Fins 218(3), 218(4) to form its semiconductor channel. Trench contacts 220(1)-220(3) are also formed in the first direction 206 to provide contacts to source/drain regions S(1)-S(4), D(1)-D(4) of the Fins 218(1)-218(4) formed in the standard cell 202. Trench contact 220(1) has been cut. A metal line 222(1) can be formed in the first metal layer (M0) 212 to provide an interconnection to the trench contact 220(1) to provide interconnections to the source or drain region S(1), D(1). Vias (V1) 224(1), 224(2) can be formed over portions of the gates 204(1)-204(4) to form metal contacts to the gates 204(1)-204(4).

One substantial factor that contributes to the performance of a FinFET, such as the FinFET 100 in FIG. 1, is the contact resistance between the source and drain contacts and their respective source and drain. In digital circuits in particular, as a particular stage switches, a high junction contact resistance of the source causes large current (I) resistance (R) (IR) drop, thereby reducing gate overdrive, which in turn reduces switching speed (i.e., increases delay). Additionally, parasitic capacitance of the FinFET reduces switching speed of the FinFET. For example, the parasitic capacitance between the gate and the source/drain and source/drain contacts adds to coupling capacitance between the gate contributing to the gate capacitance.

In this regard, with reference back to FIG. 2A, using gate 204(2) as an example, parasitic resistances of the gate 204(2) are shown as resistances $R_1$-$R_4$. Parasitic resistances $R_1$, $R_2$ are the resistances of the gate 204(2) as a function of the volume and length of the gate 204(2) in the vertical direction on the Z-axis. This is also shown in FIG. 2B, which is a perspective view of a portion of the standard cell 202 in FIG. 2A. Parasitic resistances $R_1$, $R_2$ are known as device resistances since these resistances are in the active regions where devices are formed in the standard cell 202. Parasitic resistances $R_3$, $R_4$ are lateral resistances that are a function of the volume and length of the gate 204(2) in the lateral direction on the Y-axis in both active and non-active areas of the standard cell 202. The parasitic resistances $R_3$, $R_4$ are known as layout resistances. The layout parasitic resistances $R_3$, $R_4$ of the gate 204(2) will increase in resistance for a given gate cross-section geometry as length of the gate 204(2) increases.

The trend to scale down the size of a standard cell increases gate resistance, because there is less gate material because of the decreased space between the P and N active regions, and thus less gate material. The gate may be used to provide interconnect routing between devices in the P and N active regions in the standard cell. Also, in the example of a FinFET, scaling down the size of a standard cell may require the FinFET to have a single Fin for its channel, thus further increasing device resistance. Also, scaling down the size of a standard cell increases gate resistance, because the space available for the gate fill material is reduced. Scaling down the channel length of the FinFET together with the scaling of the gate pitch also affects the width of the gate spacer, dielectric layers, and work function metal, thus reducing the available space for the actual gate fill material, because the gate spacer, dielectric layers, and work function metal layers must still be provided even if the gate width is reduced. For example, scaling down the gate length may result in a three (3) times factor reduction in the volume of gate fill material. Thus, performance of the FinFET will degrade because of the IR drop. Also, Fins in a FinFET may be fabricated taller to offset a reduction in the number of Fins included in a FinFET as the node size is scaled down while maintaining drive strength. However, reducing the number of Fins may decrease the gate geometry thus increasing resistance.

SUMMARY OF THE DISCLOSURE

Aspects disclosed herein include integrated circuits employing a field gate(s) without dielectric layers and/or work function metal layers for reduced gate layout parasitic resistance. Related methods are also disclosed. For example, an integrated circuit may include one or more Field-Effect Transistors (FETs), such as a planar FET, a FinFET, and/or a gate-all-around (GAA) (e.g., nanowire, nanoslab, or nanosheet) FET. In exemplary aspects disclosed herein, at least a portion of the dielectric layers and/or work function metal layers present in the active gate(s) are not present in a field gate(s) of a gate in a circuit cell. The field gate(s) has more conductive gate material than the active gate(s). This has the effect of increasing the conductive gate material in the field gate(s) to reduce the gate layout parasitic resistance in the circuit cell and thus the overall parasitic gate resistance of a gate in the circuit cell. In this manner, the additional volume of gate material in the field gate in the circuit cell reduces gate layout parasitic resistance in the integrated circuit, while the active gate(s) retains the dielectric layers and/or work function metal layers to effectively isolate the gate material from the channel of a FET of an integrated circuit formed according to the layout of a circuit cell to provide effective control of a channel of the FET and/or to not otherwise change the FET behavior from previous layout designs. Reducing gate layout parasitic resistance in a circuit cell can reduce the overall parasitic resistance of an integrated circuit formed according to the layout of a circuit cell using the gate to form an active gate to reduce current (I) resistance (R) (IR) drop to achieve the desired drive strength performance of FETs in the integrated circuit.

Thus for example, this reduction in parasitic resistance of a FET formed according to the layout of a circuit cell can mitigate an increase in parasitic resistance that may result from scaling where the volume of the gate is reduced. As one example, in the example of a FinFET, the designer can use the reduced field gate parasitic resistance in a circuit cell to mitigate an increase in field gate parasitic resistance if the number of Fins in the FET is reduced to support reduced scaling. This is because removing Fins from the circuit cell can increase the source/drain resistance and/or increase field gate regions in the circuit cell, thus increasing the field gate parasitic resistance. Also, in examples disclosed herein, because the topography of the active gate does not have to be altered, the processes used to fabricate the active components of the FETs can remain the same.

In this regard, in one exemplary aspect, an integrated circuit is provided that comprises a diffusion region, a non-diffusion region, a semiconductor channel, and a gate. The diffusion region is disposed above a substrate and has a longitudinal axis disposed in a first direction, and the non-diffusion region is disposed above the substrate adjacent to the diffusion region. The semiconductor channel is disposed above the substrate in the diffusion region, and has a longitudinal axis disposed in the first direction. The gate comprises a metal gate material and has a longitudinal axis in a second direction substantially orthogonal to the first direction. The gate comprises an active gate region and a field gate region. The active gate region of the metal gate material is disposed in the diffusion region in contact with the semiconductor channel to form an active gate. The active gate comprises a work function metal layer in contact with the metal gate material. The field gate region of the metal gate material is disposed in the non-diffusion region to form a field gate. The field gate does not comprise at least one of the word function metal layer and a dielectric layer.

In another exemplary aspect, a method of fabricating an integrated circuit is provided. The method comprises forming a semiconductor channel in a diffusion region above a substrate. The semiconductor channel comprises one or more channel structures each comprising a semiconductor material. The method also comprises forming a dummy gate above the substrate. The dummy gate comprises a dummy gate material and a work function metal layer, an active dummy gate disposed around at least a portion of the semiconductor channel in the diffusion region, and a field dummy gate disposed in a non-diffusion region adjacent to the diffusion region. The method further comprises removing the dummy gate material in the active dummy gate to form a first opening in an active gate region, and removing the dummy gate material and the work function metal layer in the field dummy gate to form a second opening in a field gate region. The method further comprises filling the first opening in the active gate region with a metal gate material to form an active gate, and filling the second opening in the field gate region with the metal gate material to form a field gate.

In another exemplary aspect, a method of fabricating an integrated circuit is provided. The method comprises forming a material layer stack above a diffusion region and an adjacent non-diffusion region. The material layer stack comprises a gate disposed above a substrate. The gate comprises a metal gate material and at least one of a work function metal layer and a dielectric layer. The gate is disposed above the diffusion region forming an active gate. The material layer stack further comprises a hard mask layer above the metal gate material, a lithography material layer above the hard mask layer, and a photoresist material layer above the lithography material layer. The method comprises removing at least a portion of the material layer stack above the diffusion region to form at least one opening in the material layer stack above the diffusion region down to the hard mask layer. The method further comprises filling the at least one opening with a second hard layer, and removing at least a portion of the lithography material layer and the photoresist material layer above the non-diffusion region. The method also comprises removing at least a portion of the hard mask layer, and the at least one of the work function metal layer and the dielectric layer disposed above the non-diffusion region to form a field gate

BRIEF DESCRIPTION OF THE FIGURES

FIGS. 5A-1 and 5A-2 illustrate respective cross-sectional side views of a first exemplary fabrication stage of a FET formed according to the layout of a circuit cell in FIG. 3A, before a metal gate material fill process is performed, wherein a shallow mask has been applied to protect the active gate and allow a further opening to be formed above the field gate to then allow further selective recessing of the field gate and removal of the dielectric layers and/or work function metal layers;

FIGS. 5B-1 and 5B-2 illustrate respective cross-sectional side views of a second exemplary fabrication stage of a FET formed according to the layout of a circuit cell in FIG. 3A after a gate fill material has been disposed in active gate and field gate regions after the fabrication stage shown in FIGS. 5A-1 and 5A-2;

FIGS. 5C-1 and 5C-2 illustrate respective cross-sectional side views of a third exemplary fabrication stage of recessing the gate fill material of the active gate and the field gate after the fabrication stage shown in FIGS. 5B-1 and 5B-2;

FIGS. 5D-1 and 5D-2 illustrate respective cross-sectional side views of a fourth exemplary fabrication stage of filling the recessed area in the active gate and the further recessed area in the field gate with a gate capping material after the fabrication stage shown in FIGS. 5B-1 and 5B-2;

FIG. 7A illustrates a cross-sectional side view of a first exemplary fabrication stage of a FET formed according to the layout of a circuit cell in FIG. 6, where a material layer stack with a lithography and photoresist material layer is shown that will be processed to form the FET;

FIG. 7B illustrates a cross-sectional side view of a second exemplary fabrication stage wherein a mask is formed above the material layer stack in FIG. 7A to form openings in the lithography and photoresist material layers recessed down to a hard mask in the material layer stack after the fabrication stage in FIG. 7A;

FIG. 7C illustrates a cross-sectional side view of a third exemplary fabrication stage wherein the recesses are filled with a hard mask material above an area where the active gate will be formed and the photoresist material layer removed after the fabrication stage in FIG. 7B;

FIG. 7D illustrates a cross-sectional side view of a fourth exemplary fabrication stage wherein the lithography material layer is removed after the fabrication stage in FIG. 7C;

FIG. 7E illustrates a cross-sectional side view of a fifth exemplary fabrication stage wherein the dielectric and work function metal layers of the gate are etched in areas around the active gates protected by the hard mask to form a gate for the integrated circuit from a circuit cell with the dielectric layers and/or work function metal layers present in an active gate of a gate not present in a field gate of the gate to increase gate material in the field gate to reduce gate layout parasitic resistance in the circuit cell;

DETAILED DESCRIPTION

Figure 1:
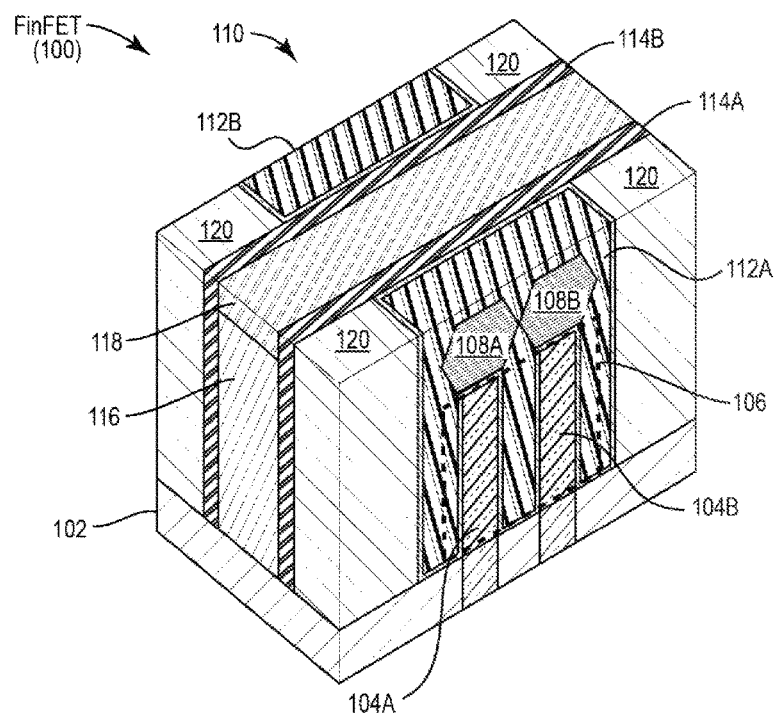
FIG. 1 is a perspective view of an exemplary Fin Field-Effect Transistor (FET) (FinFET)
Figure 2A:
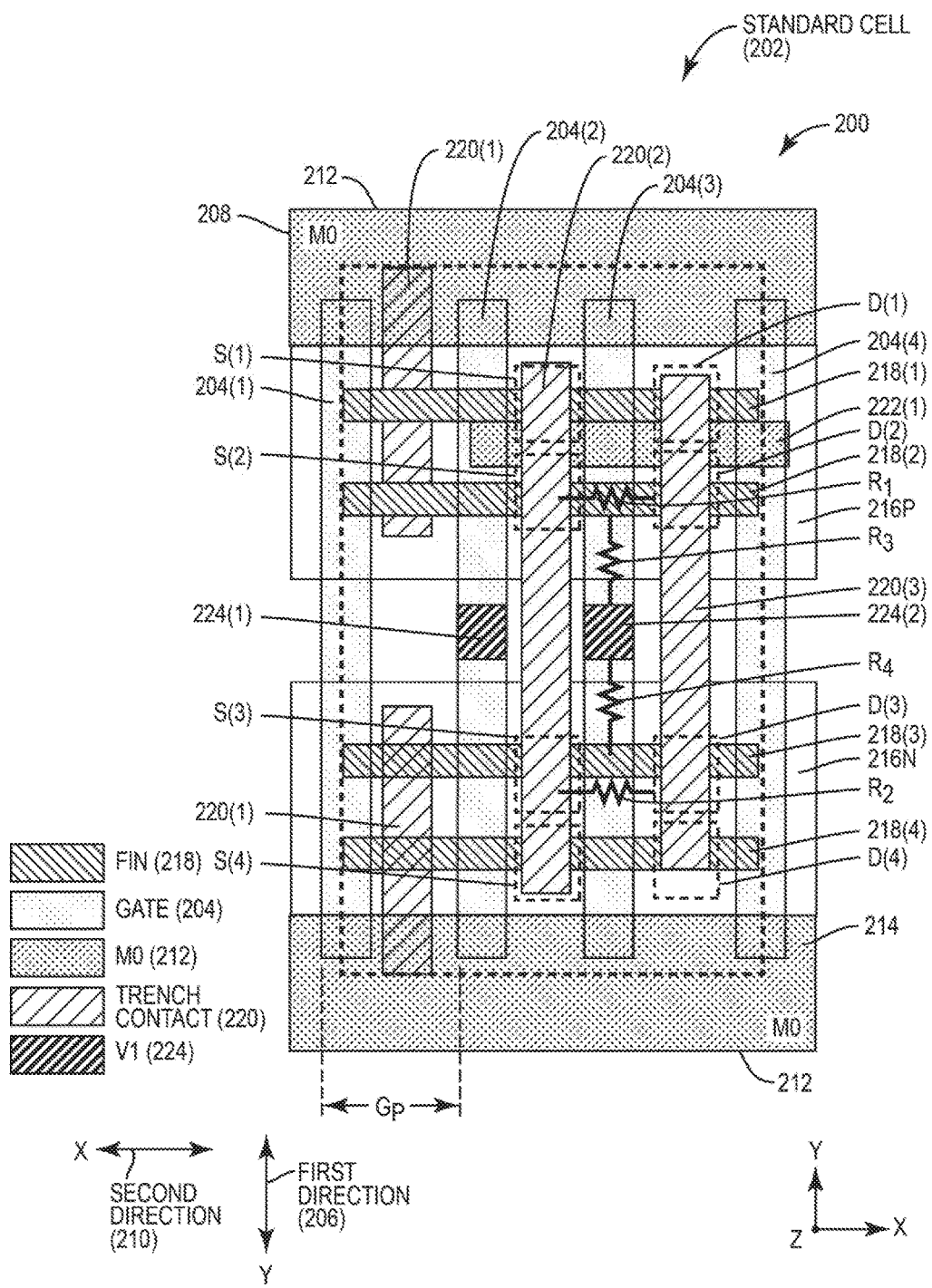
FIG. 2A is a top view of an exemplary standard cell illustrating device and layout parasitic resistances therein.
Figure 2B:
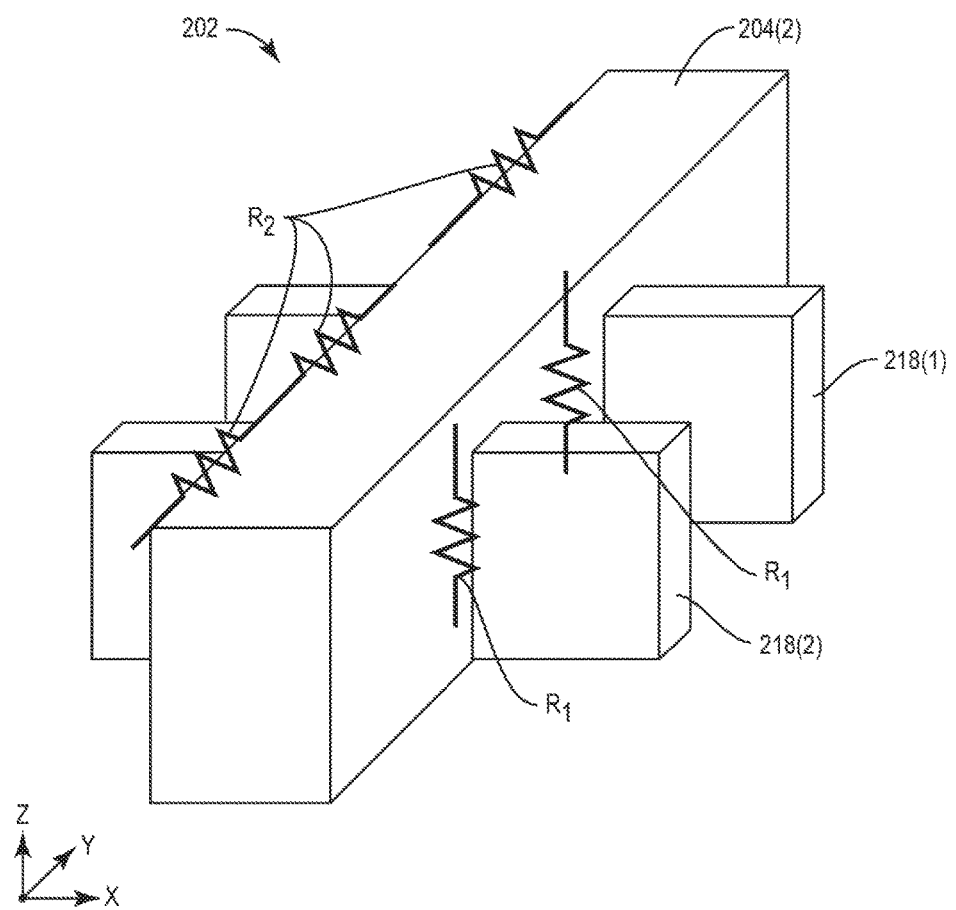
FIG. 2B is a perspective view of Fins and a gate material wrapped around Fins in the standard cell in FIG. 2A.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrated circuits employing a field gate(s) without dielectric layers and/or work function metal layers for reduced gate layout parasitic resistance. Related methods are also disclosed. For example, an integrated circuit may include one or more Field-Effect Transistors (FETs), such as a planar FET, a FinFET, and/or a gate-all-around (GAA) (e.g., nanowire, nanoslab, or nanosheet) FET. In exemplary aspects disclosed herein, at least a portion of the dielectric layers and/or work function metal layers present in the active gate(s) are not present in a field gate(s) of a gate in a circuit cell. The field gate(s) has more conductive gate material than the active gate(s). This has the effect of increasing the conductive gate material in the field gate(s) to reduce the gate layout parasitic resistance in the circuit cell and thus the overall parasitic gate resistance of a gate in the circuit cell. In this manner, the additional volume of gate material in the field gate in the circuit cell reduces gate layout parasitic resistance in the integrated circuit, while the active gate(s) retains the dielectric layers and/or work function metal layers to effectively isolate the gate material from the channel of a FET of an integrated circuit formed according to the layout of a circuit cell to provide effective control of a channel of the FET and/or to not otherwise change the FET behavior from previous layout designs. Reducing gate layout parasitic resistance in a circuit cell can reduce the overall parasitic resistance of an integrated circuit formed according to the layout of a circuit cell using the gate to form an active gate to reduce current (I) resistance (R) (IR) drop to achieve the desired drive strength performance of FETs in the integrated circuit.

Thus for example, this reduction in parasitic resistance of a FET formed according to the layout of a circuit cell can mitigate an increase in parasitic resistance that may result from scaling where the volume of the gate is reduced. As one example, in the example of a FinFET, the designer can use the reduced field gate parasitic resistance in a circuit cell to mitigate an increase in field gate parasitic resistance if the number of Fins in the FET is reduced to support reduced scaling. This is because removing Fins from the circuit cell can increase the source/drain resistance and/or increase field gate regions in the circuit cell, thus increasing the field gate parasitic resistance. Also, in examples disclosed herein, because the topography of the active gate does not have to be altered, the processes used to fabricate the active components of the FETs can remain the same.

Figure 3A:
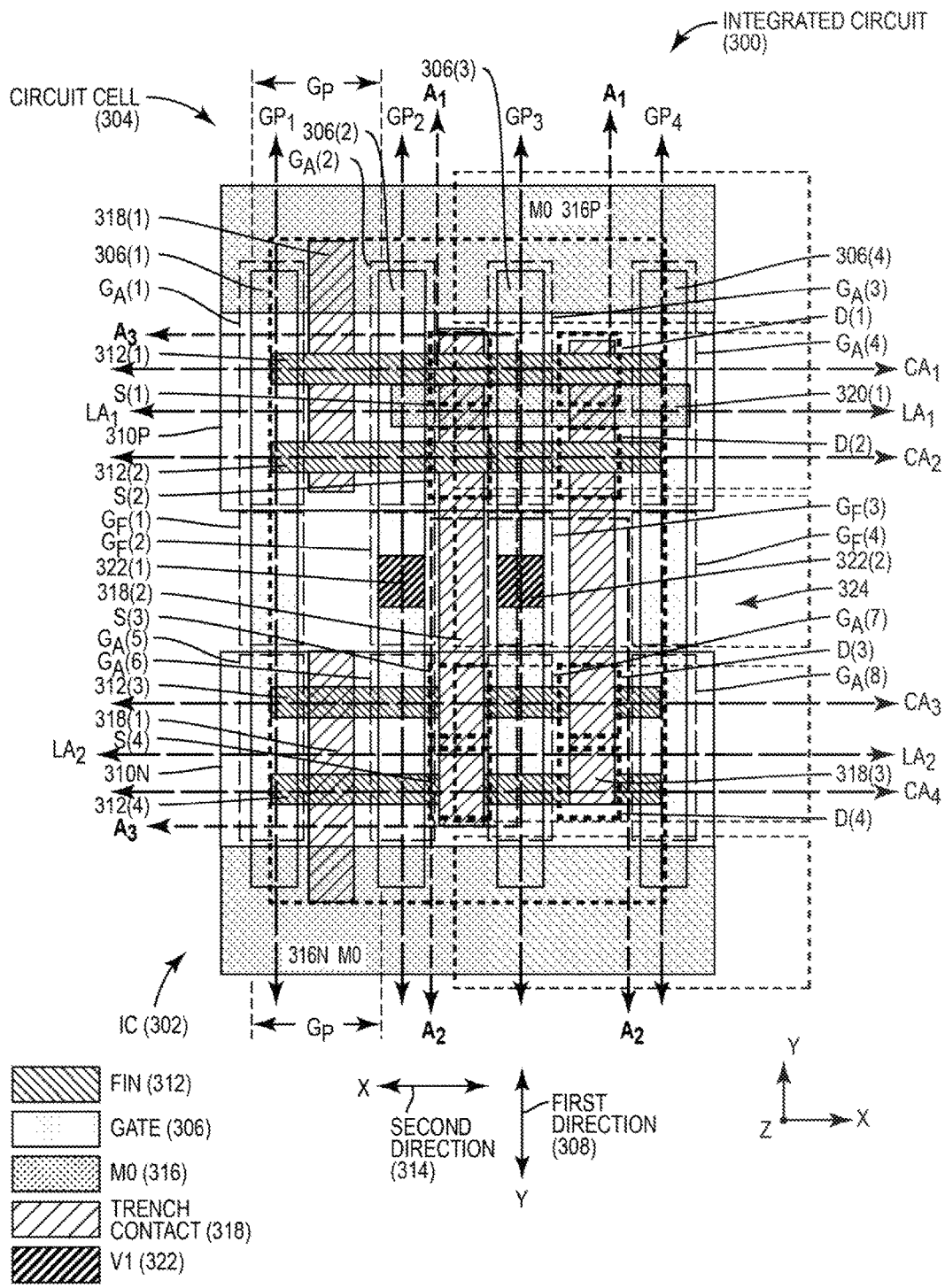
FIG. 3A is a top view of an exemplary integrated circuit formed according to the layout of a circuit cell, wherein at least a portion of dielectric layers and/or work function metal layers present in an active gate of a gate are not present in a field gate of the gate to increase gate material in the field gate to reduce gate layout parasitic resistance in the circuit cell.

In this regard, FIG. 3A is a top view of an exemplary integrated circuit 300. As will be described below in more detail, the integrated circuit 300 includes topography variation in one or more of its field gates to reduce gate parasitic resistance, and thus overall parasitic resistance of a device formed from the integrated circuit 300. For example, reducing layout parasitic resistance can mitigate an increase in layout parasitic resistance that may result from scaling, wherein the gates may be located in closer proximity to metal contacts and/or interconnects. The integrated circuit 300 can be included in a chip 302. In this example, the integrated circuit 300 is formed according to the layout of a circuit cell 304. The circuit cell 304 is a layout of components that are commonly used to fabricate semiconductor circuits, including, but not limited to, diffusion regions, gates, semiconductor channel structures, and metal interconnect lines. In this manner, when a designer is designing a particular circuit, the designer can access the circuit cell 304 as a layout, such as from a cell library, to then design the layout of active devices employing the same component layout in the circuit cell 304 to form the integrated circuit 300. In this manner, the circuit cell 304 can advantageously be repeated in a design over a semiconductor wafer or die to fabricate circuits where the components in the circuit cell 304 can be fabricated as part of a common fabrication process over multiple circuit cells in the wafer or die.

In this regard, as shown in FIG. 3A, the integrated circuit 300 formed according to the layout of a circuit cell 304 includes gates 306(1)-306(4) each having a respective longitudinal axis $GP_1$, $GP_2$, $GP_3$, $GP_4$ disposed in a first direction 308 on a Y-axis with a defined gate pitch $G_P$. The gates 306(1)-306(4) are formed from a metal gate material. The integrated circuit 300 has four (4) gates 306(1)-306(4) available to form gates of active devices in the integrated circuit 300, but note the circuit cell 304 is not limited to this particular number of gates. The circuit cell 304 also includes diffusion regions 310P, 310N of P-type doped and N-type doped semiconductor materials, respectively, for forming semiconductor channels for P-type and N-type active devices, such as P-type metal-oxide semiconductor (MOS) (PMOS) and N-type MOS (NMOS) transistors, in the integrated circuit 300. The diffusion regions 310P, 310N are aligned along respective longitudinal axes $LA_1$, $LA_2$ as shown in FIG. 3A. In this example, the circuit cell 304 supports FinFETs. In this regard, the circuit cell 304 includes semiconductor Fins 312(1)-312(4) ("Fins 312(1)-312(4)") for forming semiconductor channels of FinFETs or gate-all-around (GAA) transistors in the integrated circuit 300. The Fins 312(1)-312(4) may be fabricated from a silicon (Si) or other semiconductor material such that the Fins 312(1)-312(4) are exposed.

Semiconductor channels can be formed in the portion of the Fins 312(1)-312(4) located underneath the respective gates 306(1)-306(4). The Fins 312(1)-312(4) are disposed in the circuit cell 304 and have longitudinal axes $CA_1$, $CA_2$, $CA_3$, $CA_4$ in a second direction 314 on the X-axis substantially orthogonal to the first direction 308 and between first and second voltage rails 316P, 316N. In this example, two Fins 312(1), 312(2) are disposed in the P-type diffusion region 310P, and the other two Fins 312(3), 312(4) are disposed in the N-type diffusion region 310N. Thus, if desired, a two (2) Fin P-type transistor can be formed using Fins 312(1), 312(2), and a two (2) Fin N-type transistor can be formed using Fins 312(3), 312(4).

With continuing reference to FIG. 3A, the first voltage rail 316P and the second voltage rail 316N are formed in a metal zero (M0) layer. The first voltage rail 316P, being located adjacent to the P-type diffusion region 310P, is configured in this example to receive a positive supply voltage as it is common for P-type devices to be coupled to a positive supply voltage in complementary MOS (CMOS) circuits to be designed to function as a pull-up circuit. The second voltage rail 316N, being located adjacent to the N-type diffusion region 310N, is configured in this example to receive either a negative supply voltage or be coupled to a ground node as it is common for N-type devices to be designed to function as a pull-down circuit. Trench contacts 318(1)-318(3) are also formed in the first direction 308 to provide metal contacts to sources S(1)-S(4) and drains D(1)-D(4) of the respective Fins 312(1)-312(4). For example, the sources S(1)-S(4) and drains D(1)-D(4) disposed in the Fins 312(1)-312(4) could have been epitaxially grown on the Fins 312(1)-312(4) or the Fins 312(1)-312(4) doped to form the sources S(1)-S(4) and drains D(1)-D(4). Trench contact 318(1) has been cut. A metal line 320(1) can be formed in a first metal layer M0 to provide an interconnection between gates 306(2)-306(4) and/or trench contacts 318(2), 318(3) to provide interconnections. Vias (V1) 322 (1), 322(2) are shown as being formed over field regions of the gates 306(2), 306(3) in a non-diffusion region 324 outside of the P-type and N-type diffusion regions 310P, 310N to form metal contacts to the gates 306(2), 306(3). The non-diffusion region 324 is between the P-type and N-type diffusion regions 310P, 310N on the Y-axis.

With continuing reference to FIG. 3A, the gates 306(1)-306(4) each include active gate regions $G_A(1)$-$G_A(8)$, also referred to as active gates $G_A(1)$-$G_A(8)$, that are located above the P-type or N-type diffusion regions 310P, 310N as active areas. The active gate regions $G_A(1)$-$G_A(4)$ are located above the P-type diffusion region 310P in respective gates 306(1)-306(4). The active gate regions $G_A(5)$-$G_A(8)$ are located above the N-type diffusion region 310N in respective gates 306(1)-306(4). The active gate regions $G_A(1)$-$G_A(8)$ can be used to form gates for active devices formed in the circuit cell 304 as part of the integrated circuit 300. The gates 306(1)-306(4) also each include field gate regions $G_F(1)$-$G_F(4)$, also referred to as field gates $G_F(1)$-$G_F(4)$, that are located above the non-diffusion region 324 outside of the P-type or N-type diffusion regions 310P, 310N.

The gates 306(1)-306(4) have a parasitic resistance that is a function of the conductivity of the material that the gates 306(1)-306(4) are made from as well as the cross-sectional volume and length of the gates 306(1)-306(4) in the vertical direction on the Z-axis. The parasitic resistances of the active gate regions $G_A(1)$-$G_A(8)$ of the respective gates 306(1)-306(4) are known as device resistances since these resistances are in the active regions where devices are formed in the circuit cell 304. The field gate regions $G_F(1)$-$G_F(4)$ of the gates 306(1)-306(4) also have layout parasitic resistances that are a function of the volume and length of the respective gates 306(1)-306(4) on the Y-axis in the non-diffusion region 324 of the circuit cell 304. The device and parasitic resistances of the respective gates 306(1)-306(4) both contribute to the overall parasitic resistance of the respective gates 306(1)-304(4). The layout parasitic resistances of the gates 306(1)-306(4) will each increase in resistance for a given gate cross-section geometry as the length of the gate 306(1)-306(4) increases. The parasitic resistances of the respective gates 306(1)-306(4) affect the current (I) resistance (R) (IR) drop of devices formed by the gates 306(1)-306(4), and thus their performance. As the circuit cell 304 is scaled down to reduce the diffusion regions 310P, 310N, the length of the gates 306(1)-306(4) in the non-diffusion region 324 may increase, thus increasing their respective gate layout parasitic resistances.

Figure 3B:
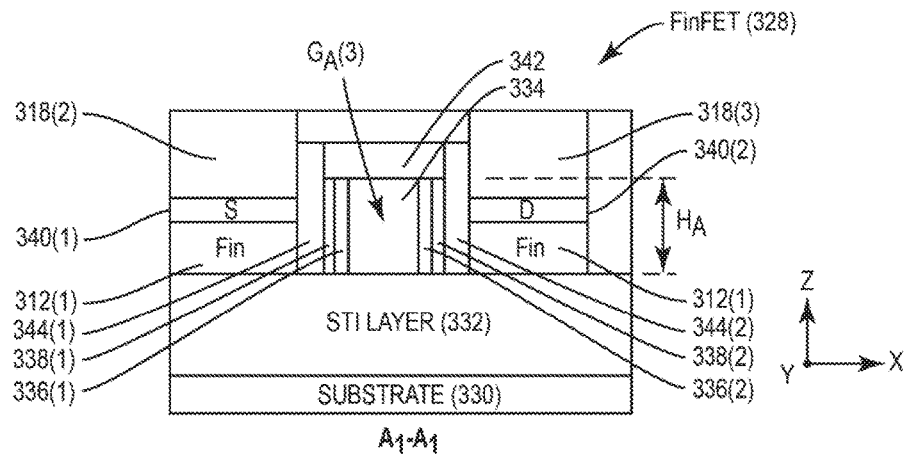
FIGS. 3B and 3C are respective cross-sectional side views of an active gate and field gate of a gate in the circuit cell in FIG. 3A to illustrate dielectric layers and work function metal layers present in the active gate of the gate, and dielectric and work function metal layers not present in a field gate of the gate to reduce the gate layout parasitic resistance in the circuit cell.

FIG. 3B is a cross-sectional side view along an $A_1$-$A_1$ line in the integrated circuit 300 in FIG. 3A of an active device in the form of a FinFET 328 having active gate $G_A(3)$ formed from the gate 306(3) in the integrated circuit 300 in FIG. 3A. As shown in FIG. 3B, the cross-sectional side view of the FinFET 328 formed in the integrated circuit 300 along the $A_1$-$A_1$ line includes a substrate 330 and a shallow trench isolation (STI) layer 332 disposed above the substrate 330. The active gate $G_A(3)$ formed from the gate 306(3) in the P-type diffusion region 310P is shown above the STI layer 332. The active gate $G_A(3)$ includes a metal gate material 334 surrounded by work function metal layers 336(1), 336(2) on each side of the metal gate material 334 on the X-axis. For example, the metal gate material 334 may be Tungsten (W), Aluminum (Al), Cobalt (Co), and Ruthenium (Ru), as examples. The work function metal layers 336(1), 336(2) are work function metal materials that can be Titanium (Ti), Nickel (Ni), Aluminum (Al), Titanium Nitride (TiN), Titanium Aluminum (TiAl), and Aluminum Nitride (AlN), as examples. Dielectric layers 338(1), 338(2), which may be a Hafnium Oxide ($HfO_2$) material, surround the respective work function metal layers 336(1), 336(2) on the X-axis. The active gate $G_A(3)$ is disposed around a portion of the Fin 312(1) wherein a semiconductor channel is formed in the Fin 312(1), but not the entire portion of the Fin 312(1). Alternatively, the active gate $G_A(3)$ could be disposed around the entire portion of the Fin 312(1) or substantially the entire portion of the Fin 312(1) to form a gate-all-around (GAA) transistor, which could be a nanowire transistor or nanoslab transistor with the Fin 312(1) forming the nanowire or nanoslab. A source S is disposed in a first region 340(1) in above the Fin 312(1) not surrounded by the active gate $G_A(3)$ adjacent to a first side of the active gate $G_A(3)$. A drain D is disposed in a second region 340(2) in or above the Fin 312(1) not surrounded by the active gate $G_A(3)$ on the opposite side of the first side of the active gate $G_A(3)$ from the source S. For example, the source S and drain D may be epitaxially grown on the respective first and second regions 340(1), 340(2) of the Fin 312(1), or the first and second regions 340(1), 340(2) of the Fin 312(1) may be doped to form the source S and drain D. A gate capping material 342, such as a Silicon Nitride (SiN) material, is disposed above the active gate $G_A(3)$ to protect the active gate $G_A(3)$. The gate capping material 342 may be planarized to have a substantially planar surface. Spacers 344(1), 344(2), which may be a Silicon Oxide Carbon (SiOC) material, are formed around the dielectric layers 338(1), 338(2). The trench contacts 318(2), 318(3) are formed above the source S and drain D to form contacts with the source S and drain D to allow interconnections in upper metal layers thereto. The trench contacts 318(2), 318(3) may be thought of as source and drain contacts.

Continuing with gate 306(3) as the example in FIG. 3B, if the gate 306(3) is fabricated as part of a common process, the field gate $G_F(3)$ of the gate 306(3) will also include the metal gate material 334 surrounded by the work function metal layers 336(1), 336(2) and the dielectric layers 338(1), 338(2) formed in the active gates $G_A(3)$, $G_A(7)$ of the gate 306(3). The work function metal layers 336(1), 336(2) and dielectric layers 338(1), 338(2) serve no purpose to isolate the field gate $G_F(3)$ from a semiconductor channel since the field gate $G_F(3)$ is located in the non-diffusion region 324 and is not used to form an active device. However, the conductivity of the work function metal layers 336(1), 336(2) and dielectric layers 338(1), 338(2) may be less than the conductivity of the metal gate material 334. Thus, if the field gate $G_F(3)$ of the gate 306(3) did not include the work function metal layers 336(1), 336(2) and/or dielectric layers 338(1), 338(2), and instead additional metal gate material 334 disposed in areas where the work function metal layers 336(1), 336(2) and/or dielectric layers 338(1), 338(2) would otherwise be disposed, the gate layout parasitic resistance of the gate 306(3) can be reduced. The metal gate material 334 has a lower resistance than the work function metal layers 336(1), 336(2) and the dielectric layers 338(1), 338(2). The additional volume of metal gate material 334 in the field gate region $G_F(3)$ reduces gate layout parasitic resistance in the integrated circuit 300, while the active gate region $G_A(3)$ retains the work function metal layers 336(1), 336(2) and dielectric layers 338(1), 338(2) to effectively isolate the metal gate material 334 from the semiconductor channel of the FinFET 328 to provide effective control of the semiconductor channel and/or to not otherwise change the FinFET 328 behavior from previous layout designs. Reducing gate layout parasitic resistance can reduce the overall parasitic resistance of the integrated circuit 300 to reduce current (I) resistance (R) (IR) drop to achieve the desired drive strength performance of the FinFET 328 in the integrated circuit 300.

In this regard, as discussed below with regard to FIGS. 3C and 3D, at least a portion of a field gate $G_F(1)$-$G_F(4)$ of at least one gate 306(1)-306(4) in the integrated circuit 300 in FIG. 3A does not include the work function metal layers 336(1), 336(2) and/or dielectric layers 338(1), 338(2) that are included in the respective active gates $G_A(1)$-$G_A(8)$ to reduce gate layout parasitic resistance. For example, as discussed below, the gate 306(1)-306(4) may be fabricated such that the work function metal layers 336(1), 336(2) and/or dielectric layers 338(1), 338(2) initially formed in the respective field gate $G_F(1)$-$G_F(4)$ are removed and replaced with the metal gate material 334. In this manner, the overall volume of metal gate material 334 of a respective gate 306(1)-306(4) can be retained while increasing its conductivity to reduce gate layout parasitic resistance. The work function metal layers 336(1), 336(2) and/or dielectric layers 338(1), 338(2) surrounding the metal gate material 334 in the active gates $G_A(1)$-$G_A(8)$ can remain. This can allow the desired geometry of a gate 306(1)-306(4) to provide effective control of a semiconductor channel of an active device formed having an active gate $G_A(1)$-$G_A(8)$ while reducing gate layout parasitic resistance in the circuit cell 304 to reduce the overall parasitic resistance of the integrated circuit 300 to achieve the desired performance of active devices formed in the integrated circuit 300.

Figure 3C:
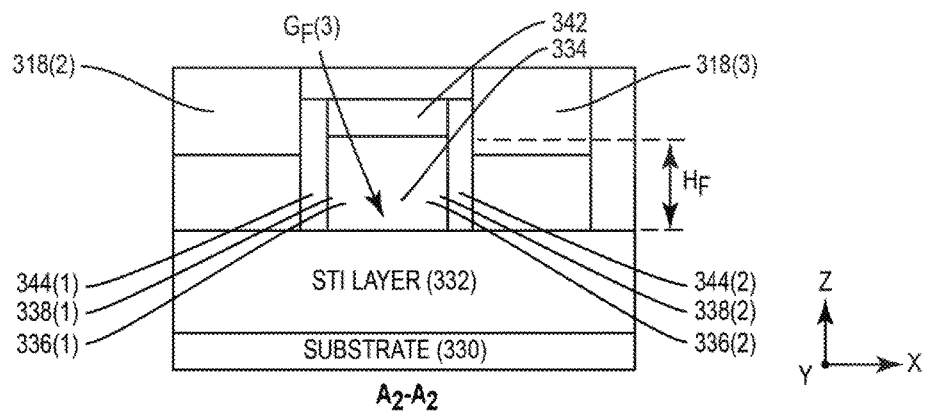
Figure 3D:
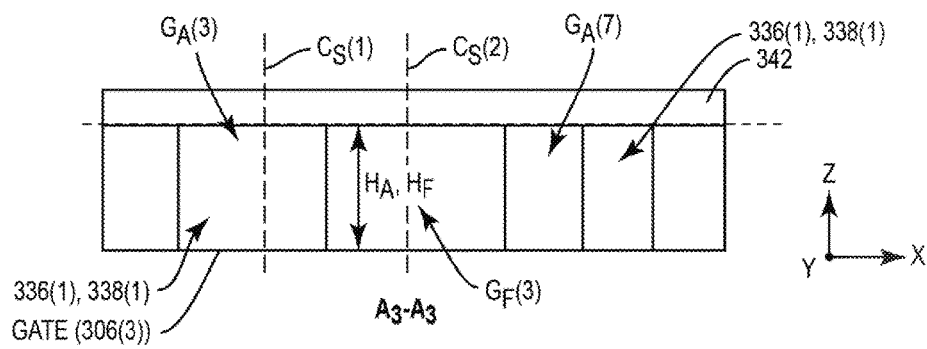
FIG. 3D is a cross-sectional side view of the gate in the circuit cell in FIG. 3A.

In this regard, FIG. 3C is a cross-sectional side view along an $A_2$-$A_2$ line in the integrated circuit 300 in FIG. 3A illustrating a field gate $G_F(3)$ of the gate 306(3) in the integrated circuit 300 as an example. FIG. 3D is a cross-sectional side view along an $A_3$-$A_3$ line of the gate 306(3) in the integrated circuit 300 in FIG. 3A showing both active gates $G_A(3)$, $G_A(7)$ and the field gate $G_F(3)$ therein to further illustrate the metal gate material 334 forming the field gate $G_F(3)$ with the absence of work function metal layers 336(1), 336(2) and/or dielectric layers 338(1), 338(2) in the field gate $G_F(3)$. Note that in the example of FIG. 3C, the field gate $G_F(3)$ does not include the metal gate material 334 surrounded by the work function metal layers 336(1), 336(2) and the dielectric layers 338(1), 338(2) like the active gate $G_A(3)$ illustrated in FIG. 3B. However, note that the field gate $G_F(3)$ could include dielectric layers 338(1), 338(2) without the work function metal layers 336(1), 336(2), or vice versa. As shown in FIG. 3D, the height $H_F$ of the field gate $G_F(3)$ is the same as the height $H_A$ of the active gate $G_A(3)$ in this example. However, the height $H_F$ of the field gate $G_F(3)$ could be smaller or larger than the height $H_A$ of the active gate $G_A(3)$.

Thus, this variation in material and topography between the active gates $G_A(1)$-$G_A(8)$ and the field gates $G_F(1)$-$G_F(4)$ of the respective gates 306(1)-306(4) can reduce the gate layout parasitic resistance in the circuit cell 304. This can mitigate an increase in parasitic resistance that may result from scaling wherein the gates 306(1)-306(4) in the circuit cell 304 may be longer in length due to the scaling down of the diffusion regions 310P, 310N. In this manner, a designer can scale the parasitic resistance of the integrated circuit 300 by controlling the field gate $G_F(1)$-$G_F(4)$ material and/or topography in the circuit cell 304. As in the example of the FinFET 328, the designer can use the reduced parasitic resistance of the field gate $G_F(3)$ to mitigate an increase in parasitic resistance in the active gates $G_A(3)$, $G_A(7)$ and/or other elements of the FinFET 328 due to reduced scaling. Also, in examples disclosed herein of the gate 306(3) in FIGS. 3A-3D, because the topography of active gates $G_A(3)$, $G_A(7)$ therein does not have to be altered, the processes used to fabricate the active components of the FinFET 328 can remain the same if desired.

With reference back to FIG. 3D, in this example, an area of a cross-section $C_S(1)$ of at least a portion of the active gate $G_A(3)$ may be the same as an area of a cross-section $C_S(2)$ of at least a portion of the field gate $G_F(3)$. The height $H_A$ of the active gate $G_A(3)$ may be between 30-90 nanometers (nm) as an example. The height $H_F$ of the field gate $G_F(3)$ may also be between 30-90 nanometers (nm) as an example A ratio of an area of the metal gate material 334 in the cross-section $C_S(1)$ of at least a portion of the active gate $G_A(3)$ to an area of the metal gate material 334 in the cross-section $C_S(2)$ of at least a portion of the field gate $G_F(3)$ may be at least 1.5 (one and half) as an example A ratio of the height $H_A$ of the cross-section $C_S(1)$ of at least a portion of the active gate $G_A(3)$ to the height $H_F$ of the cross-section $C_S(2)$ of at least a portion of the field gate $G_F(3)$ may be at least 1.5 (one and half) as an example.

Figure 4:
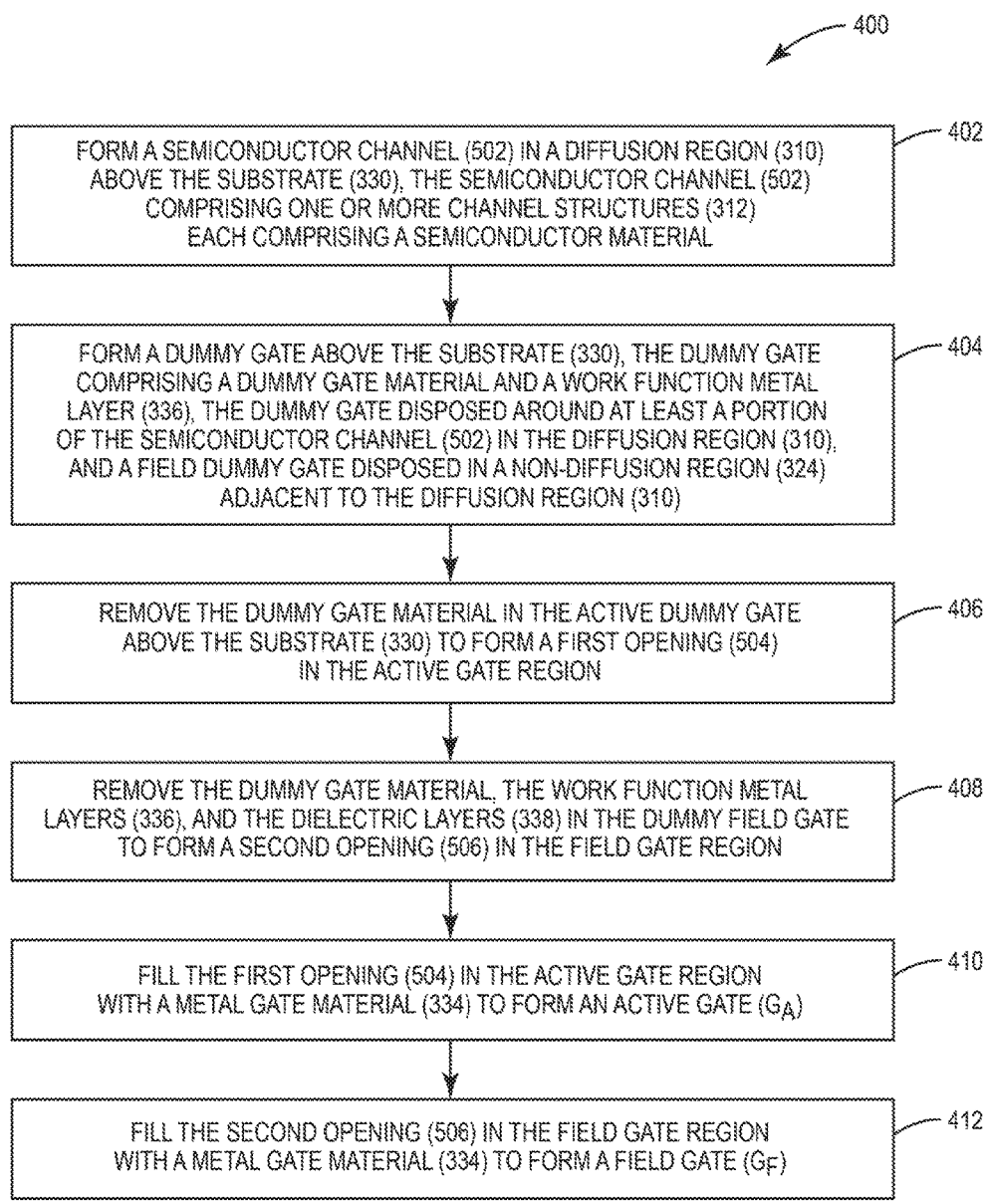
FIG. 4 is a flowchart illustrating an exemplary process of fabricating an integrated circuit according to the layout of a circuit cell, such as the integrated circuit according to the layout of the circuit cell in FIGS. 3A-3D, wherein at least a portion of the dielectric layers and/or work function metal layers present in an active gate of a gate are not present in a field gate of the gate to increase gate material in the field gate to reduce gate layout parasitic resistance in the circuit cell.

FIG. 4 is a flowchart illustrating an exemplary process 400 of fabricating an integrated circuit in a circuit cell, like the integrated circuit 300 in the circuit cell 304 in FIGS. 3A-3D, wherein the integrated circuit 300 forms a field gate in a gate in the circuit cell 304 having reduced gate layout parasitic resistance. The process 400 in FIG. 4 will be described in conjunction with exemplary fabrication stages of the integrated circuit 300 in FIGS. 5A-1-5D-2 below. Common elements and/or materials between the integrated circuit 300 in FIGS. 3A-3D and the fabrication stages shown in FIGS. 5A-1-5D-2 of the integrated circuit 300 are shown with common element numbers and thus will not be redescribed.

Figures 1, 2, 5A:
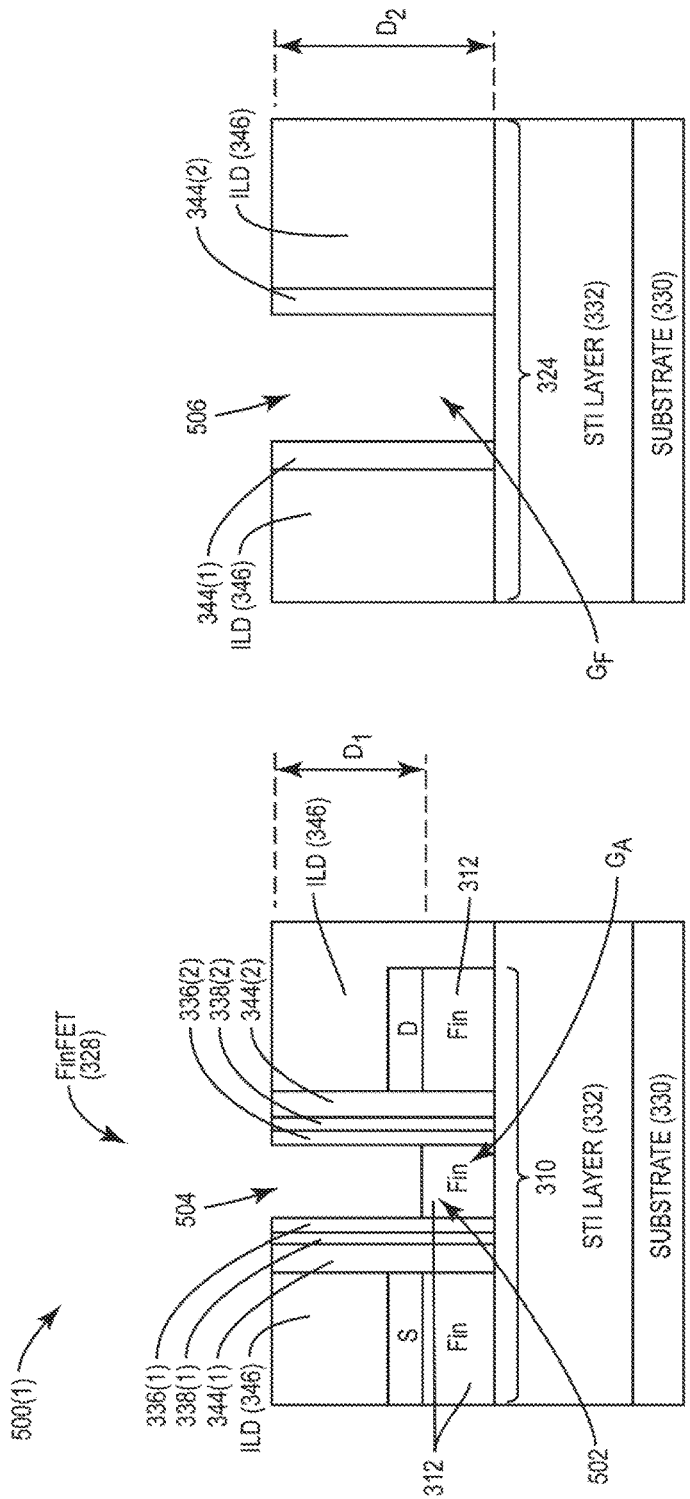

In this regard, with reference to fabrication stage 500(1) in FIG. 5A-1, a first fabrication step to fabricate the integrated circuit 300 can to be form a semiconductor channel 502 in a diffusion region 310 above the substrate 330, wherein the semiconductor channel 502 comprises one or more fins 312 (as channel structures) each comprising a semiconductor material (block 402 in FIG. 4). FIGS. 5A-1 and 5A-2 illustrate respective cross-sectional side views of a first exemplary fabrication stage 500(1) of the FinFET 328 formed according to the layout of a circuit cell 304 as the integrated circuit 300 in FIG. 3A after active and field dummy gates have been formed with a dummy gate material (block 404 in FIG. 4), and then the dummy gate material is removed from respective openings 504, 506 formed in the active gate region $G_A$ and the field gate region $G_F$ down by respective depths $D_1$, $D_2$. The dummy gate is formed above the substrate 330, wherein the dummy gate includes a dummy gate material, the work function metal layers 336(1), 336(2), and the dielectric layers 338(1), 338(2) (block 404 in FIG. 4). The dummy gate includes an active dummy gate disposed around at least a portion of the semiconductor channel 502 in the diffusion region 310, and a field dummy gate disposed in the non-diffusion region 324 adjacent to the diffusion region 310. Then, the dummy gate material is removed from the active dummy gate to form the first opening 504 in the active gate region $G_A$ (block 406 in FIG. 4). The dummy gate material is removed from the field dummy gate to form the second opening 506 in the field gate region $G_F$ (block 408 in FIG. 4). The work function metal layers 336(1), 336(2) and the dielectric layers 338(1), 338(2) are removed in the field gate region $G_F$ as shown in FIG. 5A-2, but not in the active gate region $G_A$ in FIG. 5A-1 as part of the dummy gate removal process. A mask is applied as part of a lithography process to protect the field gate region $G_F$ to form an opening above the active gate region $G_A$ to then remove the dummy gate material in the active gate region $G_A$ as shown in FIG. 5A-1 to form the first opening 504. Then, another mask is applied as part of a lithography process to protect the active gate region $G_A$ to form an opening above the field gate region $G_F$ to then remove the dummy gate material as well as the work function metal layers 336(1), 336(2) and the dielectric layers 338(1), 338(2) in the field gate region $G_F$ as shown in FIG. 5A-2 to form the second opening 506.

Thereafter, as shown in a second fabrication stage 500(2) in FIGS. 5B-1 and 5B-2, the openings 504, 506 in the active gate region $G_A$ and the field gate region $G_F$ are filled with metal gate material 334 (blocks 410 and 412 in FIG. 4). In this example, the openings 504, 506 in the active gate region $G_A$ and the field gate region $G_F$ are filled with the metal gate material 334 to have a substantially planar first top surface 508 at a first height $H_1$ above the substrate 330 and the STI layer 332. As shown in FIGS. 5B-1 and 5B-2, the gate 306 includes the active gate region $G_A$ of the metal gate material 334 disposed adjacent to at least a portion of the semiconductor channel 502 in the diffusion region 310, and a field gate region $G_F$ of the metal gate material 334 disposed in the non-diffusion region 324 adjacent to the diffusion region 310. The active gate region $G_A$ includes the metal gate material 334 surrounded by the work function metal layers 336(1), 336(2), which are then surrounded by the dielectric layers 338(1), 338(2) at the first height $H_1$. The field gate region $G_F$ includes the metal gate material 334 also at the first height $H_1$, but does not include the previously removed work function metal layers 336(1), 336(2) and dielectric layers 338(1), 338(2). In this example, the source S and drain D of the FinFET 328 are epitaxially grown above the portions of the Fin 312 not surrounded by the active gate region $G_A$. Spacers 344(1), 344(2) are formed around the active gate region $G_A$. The spacers 344(1), 344(2) may have been formed adjacent to the gate 306 in a previous step wherein an opening was created therebetween to dispose the dielectric layers 338(1), 338(2), the work function metal layers 336(1), 336(2), and the metal gate material 334. An interlayer dielectric (ILD) 346 surrounds the source S and drain D and active gate region $G_A$.

With reference back to FIG. 4, and as shown in fabrication stage 500(3) in FIGS. 5C-1 and 5C-2, a next fabrication step may be to remove the metal gate material 334 to a depth $D_3$ below the first top surface 508 to recess the metal gate material 334 in the active gate region $G_A$ to a second top surface 510 above the substrate 330 to form a third opening 509 in the active gate region $G_A$, as shown in FIG. 5C-1. This next fabrication step may also include removing the metal gate material 334 of a depth $D_4$ in the field gate region $G_F$ to a third top surface 512 above the substrate 330 to form a fourth opening 514 in the field gate region $G_F$, as shown in FIG. 5C-2. These steps can be performed to prepare the active gate region $G_A$ and the field gate region $G_F$ to be of the desired respective height $H_A$, $H_F$ based on design considerations for active gate region $G_A$ control of the semiconductor channel 502 and to prepare for a gate capping material to be disposed above the active gate region $G_A$ and the field gate region $G_F$ in a later processing step to protect the active gate region $G_A$ and the field gate region $G_F$.

With reference back to FIG. 4, and as shown in fabrication stage 500(4) in FIGS. 5D-1 and 5D-2, the third opening 509 in the active gate region $G_A$ and fourth opening 514 in the field gate region $G_F$ can be filled with a gate capping material 342 to protect the active gate region $G_A$ and the field gate region $G_F$. The gate capping material 342 may be planarized to have a substantially planar surface. The FinFET 328 is formed as shown in FIG. 5D-1.

Figure 6:
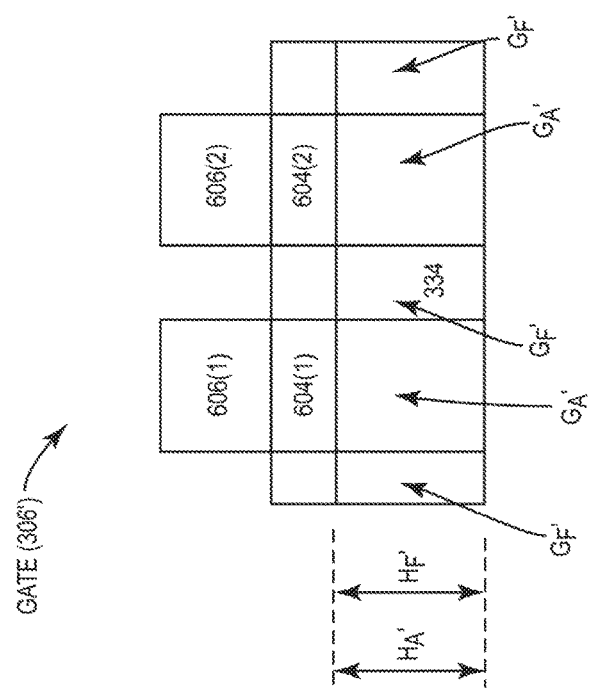
FIG. 6 is a side view of another exemplary integrated circuit formed according to the layout of a circuit cell, wherein at least a portion of the dielectric layers and/or work function metal layers present in an active gate of a gate are not present in a field gate of the gate to increase gate material in the field gate to reduce gate layout parasitic resistance in the circuit cell.

The fabrication processes for forming the gates 306(1)-306(4) in the integrated circuit 300 in FIGS. 3A-3D use an active removal and fill process to form the metal gate material 334 at the desired volume for the field gate region $G_F$ to reduce the gate layout parasitic resistance. A fabrication process can also be employed to form the gates 306(1)-306(4) by a non-active, removal process to form the metal gate material 334 at the desired volume for the field gate region $G_F$ to reduce the gate layout resistance. In this regard, FIG. 6 is a side view of another exemplary gate 306' formed in a circuit cell, such as the circuit cell 304, having a field gate $G_F$' in the gate 306' without the work function metal layers 336(1), 336(2) and/or dielectric layers 338(1), 388(2) from a gate material removal process for reduced gate layout parasitic resistance. As shown in FIG. 6, the gate 306' is formed by a metal gate material 334 that includes active gate regions $G_A$' and field gate regions $G_F$'. The field gate regions $G_F$' are of a height $H_F$' and the active gate regions $G_A$' are of a height $H_A$' like in FIGS. 3A-3D. Hard mask layers 604(1), 604(2) are disposed above the active gate regions $G_A$' as a remnant of a previous continuous hard mask layer formed over the entire gate 306' before etching processes were performed to form the field gate regions $G_F$'. Hard mask layers 606(1), 606(2) are disposed above the active gate regions $G_A$' as a function of the fabrication process to protect the active gate regions $G_A$' during an etching process of the field gate regions $G_F$'.

FIG. 7A-7E illustrate an exemplary fabrication process to fabricate the gate 306' in FIG. 6. FIG. 7A illustrates a cross-sectional side view of a first exemplary fabrication stage 700(1) of the gate 306' in FIG. 6. A material layer stack 701 is formed above a diffusion region and an adjacent non-diffusion region, such as diffusion regions 310P, 310N and non-diffusion region 324 in the circuit cell 304 in FIG. 3A. The material layer stack 701 comprises the metal gate material 334, a hard mask layer (HM) 604 disposed above the metal gate material 334, a lithography material layer (LITHO) 702 disposed above the hard mask layer 604 and a photoresist material layer (PR) 704 disposed above the lithography material layer 702. Height $H_A$' of the metal gate material 334 can be the ending height of the active gate regions $G_A$' that will be formed in the material layer stack 701.

As shown in FIG. 7B, in a second fabrication stage 700(2), a mask can be applied above the material layer stack 701 and an etch process can be performed to expose one or more portions of the material layer stack 701 above the diffusion region in openings 706(1), 706(2) where the active gate regions $G_A$' are desired to be formed. Portions of the photoresist material layer 704(1)-704(3) and the lithography material layer 702(1)-702(3) remain that were not removed to form the openings 706(1), 706(2). Then, in a third fabrication stage 700(3) as shown in FIG. 7C, the openings 706(1), 706(2) are filled with another hard mask material to form the hard mask layers 606(1), 606(2) and the remaining portions of the photoresist material layer 704 are removed. The top surface of the hard mask layers 606(1), 606(2) may be planarized, such as through a chemical mechanical planarization (CMP) process. Then, in a fabrication stage 700(4) as shown in FIG. 7D, a mask can be applied above the material layer stack 701 and, via an etch process, the remaining portions of the lithography material layer 702 are removed. This leaves the additional hard mask layers 606 (1), 606(2) disposed above the hard mask layer 604. Openings 708(1)-708(3) are formed as a result of removing the remaining portions of the lithography material layer 702. In a fabrication stage 700(5) in FIG. 7E, a portion of the hard mask layer 604 and the metal gate material 334 being further etched in the openings 708(1)-708(3) form the field gate regions $G_F$' with the work function metal layer 336 removed from the field gate regions $G_F$'. FIG. 7E is the gate 306' in FIG. 6.

An integrated circuit formed according to the layout of a circuit cell, wherein at least a portion of dielectric layers and/or work function metal layers present in an active gate of a gate are not present in a field gate of the gate to increase gate material in the field gate to reduce gate layout parasitic resistance in the circuit cell, can also be employed in planar and GAA transistors. An integrated circuit formed from a circuit cell, wherein at least a portion of dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
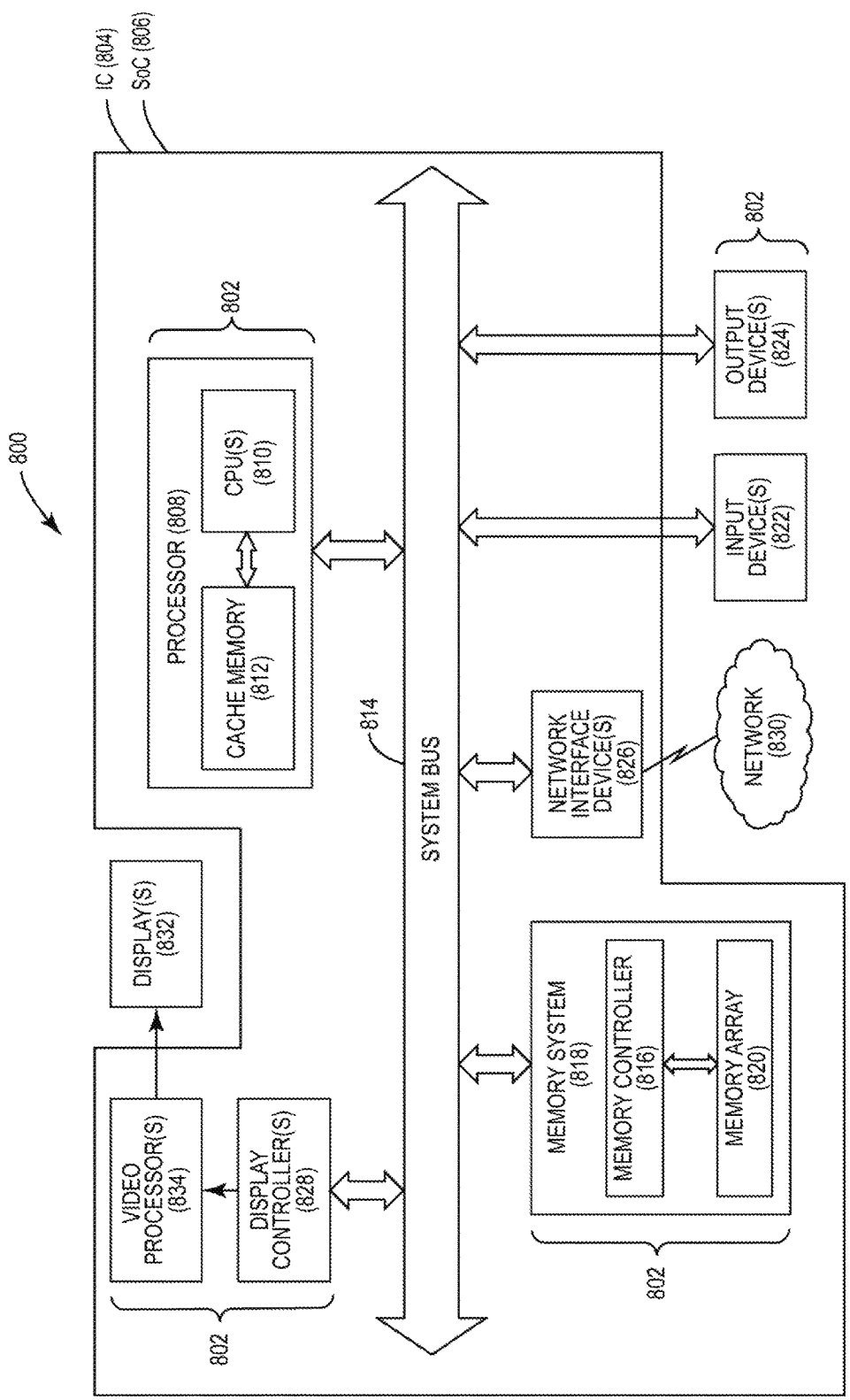
FIG. 8 is a block diagram of an exemplary processor-based system that can include integrated circuits formed according to the layout of a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuits and gates in FIGS. 3A, 5A-1 and 5D-2, 6, and 7E.

In this regard, FIG. 8 illustrates an example of a processor-based system 800 that can include an integrated circuit 802 formed from a circuit cell, wherein at least a portion of dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein. In this example, the processor-based system 800 may be formed as an IC 804 in a system-on-a-chip (SoC) 806. The processor-based system 800 includes a processor 808 that includes one or more central processor units (CPUs) 810, which may also be referred to as CPU or processor cores. The processor 808 may have cache memory 812 coupled to the processor(s) 808 for rapid access to temporarily stored data. As an example, the cache memory 812 could include integrated circuits 802 formed from a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein. The processor 808 is coupled to a system bus 814 and can intercouple master and slave devices included in the processor-based system 800. As is well known, the processor 808 communicates with these other devices by exchanging address, control, and data information over the system bus 814. For example, the processor 808 can communicate bus transaction requests to a memory controller 816 as an example of a slave device. Although not illustrated in FIG. 8, multiple system buses 814 could be provided, wherein each system bus 814 constitutes a different fabric.

Other master and slave devices can be connected to the system bus 814. As illustrated in FIG. 8, these devices can include a memory system 818 that includes the memory controller 816 and a memory array(s) 820, one or more input devices 822, one or more output devices 824, one or more network interface devices 826, and one or more display controllers 828, as examples. Each of the memory system 818, the one or more input devices 822, the one or more output devices 824, the one or more network interface devices 826, and the one or more display controllers 828 can include integrated circuits 802 formed from a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The processor 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, a light emitting diode (LED) display, etc. The display controller(s) 828, display(s) 832, and/or the video processor(s) 834 can include integrated circuits 802 formed from a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein.

Figure 9:
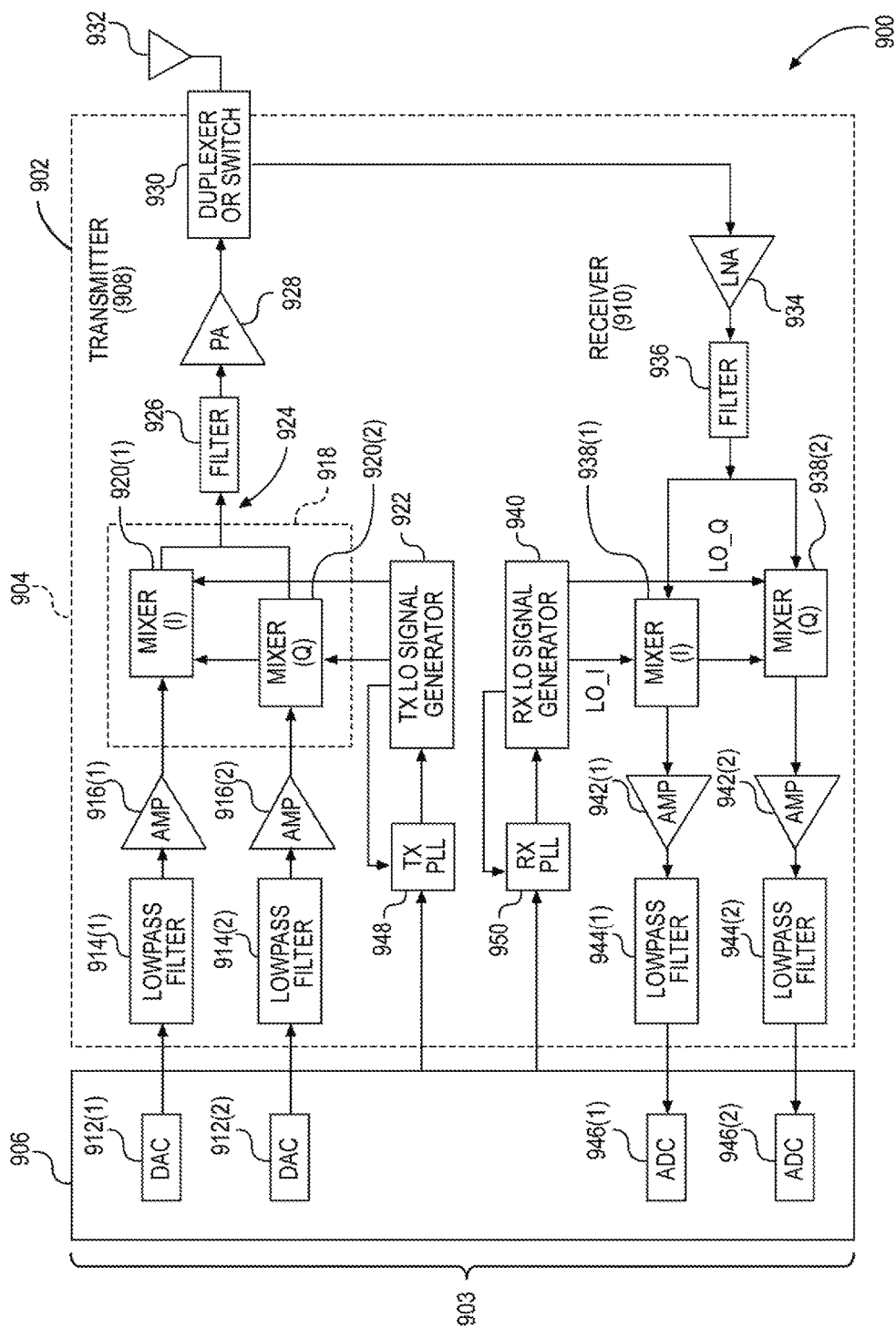
FIG. 9 is a block diagram of an exemplary wireless communications device that includes radio frequency (RF) components formed from an integrated circuit (IC), wherein any of the components therein can include integrated circuits formed according to the layout of a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuits and gates in FIGS. 3A, 5A-1 and 5D-2, 6, and 7E.

FIG. 9 illustrates an exemplary wireless communications device 900 that includes radio frequency (RF) components formed from an IC 902, wherein any of the components therein can include integrated circuits 903 formed from a circuit cell, wherein at least a portion of the dielectric layers and/or work function metal layers present in an active gate of a gate are not present in a field gate of the gate to increase gate material in the field gate to reduce gate layout parasitic resistance in the circuit cell, including, but not limited to, the integrated circuit 300 and gates 306, 306' in FIGS. 3A, 5A-1 and 5D-2, 6, and 7E, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into the I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals through mixers 920(1), 920(2) from a TX LO signal generator 922 to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmitted RF signal. The transmitted RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by amplifiers (AMPs) 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit, comprising:
   a diffusion region disposed above a substrate and having a longitudinal axis disposed in a first direction;
   a non-diffusion region disposed above the substrate adjacent to the diffusion region;
   a semiconductor channel disposed above the substrate in the diffusion region, the semiconductor channel having a longitudinal axis disposed in the first direction; and
   a gate comprising a metal gate material and having a longitudinal axis in a second direction substantially orthogonal to the first direction, the gate comprising:
      an active gate region of the metal gate material disposed in the diffusion region in contact with the semiconductor channel to form an active gate, the active gate comprising a work function metal layer in contact with the metal gate material; and
      a field gate region of the metal gate material disposed in the non-diffusion region to form a field gate, the field gate not comprising at least one of the work function metal layer and a dielectric layer.

2. The integrated circuit of claim 1, wherein the active gate further comprises the dielectric layer in contact with the work function metal layer.

3. The integrated circuit of claim 2, wherein the field gate does not comprise the work function metal layer and the dielectric layer.

4. The integrated circuit of claim 1, wherein a ratio of an area of the metal gate material in a cross-section of at least a portion of the active gate to an area of the metal gate material in a cross-section of at least a portion of the field gate is at least 1.5.

5. The integrated circuit of claim 1, wherein a height of the active gate is substantially the same as a height of the field gate.

6. The integrated circuit of claim 1, wherein a height of a cross-section of at least a portion of the active gate is greater than a height of a cross-section of at least a portion of the field gate.

7. The integrated circuit of claim 1, wherein a ratio of a height of a cross-section of at least a portion of the active gate to a height of a cross-section of at least a portion of the field gate is at least 1.5.

8. The integrated circuit of claim 1, wherein:
   the diffusion region comprises:
      a P-type diffusion region disposed above the substrate and having a longitudinal axis disposed in the first direction; and
      an N-type diffusion region disposed above the substrate and having a longitudinal axis disposed in the first direction substantially parallel to the longitudinal axis of the P-type diffusion region; and
   the non-diffusion region is further disposed between the P-type diffusion region and the N-type diffusion region.

9. The integrated circuit of claim 1, further comprising a planar transistor comprising:
   the semiconductor channel disposed in the diffusion region above the substrate;
   a source disposed in a well region on a first side of the semiconductor channel;
   a drain disposed in the well region on a second side of the semiconductor channel opposite of the first side; and
   the dielectric layer disposed above the semiconductor channel between the semiconductor channel and the active gate.

10. The integrated circuit of claim 1, further comprising a Fin Field-Effect Transistor (FET) (FinFET) comprising:
    the semiconductor channel comprising at least one semiconductor Fin disposed in the diffusion region above the substrate, the at least one semiconductor Fin having a longitudinal axis disposed in the first direction;
    the active gate disposed around at least a portion of the at least one semiconductor Fin;
    a source disposed in a first region of the at least one semiconductor Fin not surrounded by the active gate adjacent to a first side of the active gate; and
    a drain disposed in a second region of the at least one semiconductor Fin not surrounded by the active gate adjacent to a second side of the active gate opposite of the first side of the active gate.

11. The integrated circuit of claim 1, further comprising a gate-all-around (GAA) transistor comprising:
    the active gate disposed around the semiconductor channel;
    a source disposed in a first region of the semiconductor channel not surrounded by the active gate adjacent to a first side of the active gate; and
    a drain disposed in a second region of the semiconductor channel not surrounded by the active gate adjacent to a second side of the active gate opposite of the first side of the active gate.

12. The integrated circuit of claim 1, further comprising a gate capping material disposed above the active gate and the field gate, the gate capping material having a substantially planar top surface.

13. The integrated circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of fabricating an integrated circuit, comprising:
forming a semiconductor channel in a diffusion region above a substrate, the semiconductor channel comprising one or more channel structures each comprising a semiconductor material;
forming a dummy gate above the substrate, the dummy gate comprising a dummy gate material and a work function metal layer, an active dummy gate disposed around at least a portion of the semiconductor channel in the diffusion region, and a field dummy gate disposed in a non-diffusion region adjacent to the diffusion region;
removing the dummy gate material in the active dummy gate to form a first opening in an active gate region;
removing the dummy gate material and the work function metal layer in the field dummy gate to form a second opening in a field gate region;
filling the first opening in the active gate region with a metal gate material to form an active gate; and
filling the second opening in the field gate region with the metal gate material to form a field gate.

15. The method of claim 14, wherein:
forming the dummy gate comprises forming the dummy gate material, the work function metal layer in contact with the dummy gate material, and a dielectric layer in contact with the work function metal layer above the substrate, the dummy gate comprising the active dummy gate disposed around at least a portion of the semiconductor channel in the diffusion region, and the field dummy gate disposed in the non-diffusion region adjacent to the diffusion region; and
further comprising:
removing the dielectric layer in the field dummy gate to form the second opening in the field gate region.

16. The method of claim 15, wherein a ratio of an area of the metal gate material in a cross-section of at least a portion of the active gate to an area of the metal gate material in a cross-section of at least a portion of the field gate is at least 1.5.

17. The method of claim 15, wherein a top surface of the active gate and a top surface of the field gate are substantially planar.

18. The method of claim 15, wherein a top surface of the active gate and a top surface of the field gate are not substantially planar.

19. The method of claim 15, further comprising disposing a gate capping material above the metal gate material in the second opening in the field gate region and disposing the gate capping material above the metal gate material in the first opening in the active gate region.

20. A method of fabricating an integrated circuit, comprising:
forming a material layer stack above a diffusion region and an adjacent non-diffusion region, comprising:
a gate disposed above a substrate, the gate comprising a metal gate material and at least one of a work function metal layer and a dielectric layer, the gate disposed above the diffusion region forming an active gate;
a hard mask layer above the metal gate material;
a lithography material layer above the hard mask layer; and
a photoresist material layer above the lithography material layer;
removing at least a portion of the material layer stack above the diffusion region to form at least one opening in the material layer stack above the diffusion region down to the hard mask layer;
filling the at least one opening with a second hard mask layer;
removing at least a portion of the lithography material layer and the photoresist material layer above the non-diffusion region; and
removing at least a portion of the hard mask layer, and the at least one of the work function metal layer and the dielectric layer disposed above the non-diffusion region to form a field gate.

21. The method of claim 20, further comprising planarizing a top surface of the second hard mask layer to a top surface of the material layer stack.

* * * * *